US006163455A

United States Patent [19]

James

[11] Patent Number: 6,163,455

[45] Date of Patent: Dec. 19, 2000

[54] THERMAL ATTACHMENT BRACKET FOR MINI CARTRIDGE PACKAGE TECHNOLOGY

[75] Inventor: Gregory A. James, San Jose, Calif.

[73] Assignee: Intel Corporation, Santa Clara, Calif.

[21] Appl. No.: 09/229,394

[22] Filed: Jan. 11, 1999

[51] Int. Cl.[7] .......... H05K 7/20

[52] U.S. Cl. .......... 361/704; 361/707; 361/712; 361/713; 361/719; 257/718; 257/719; 257/726; 257/727; 174/16.3; 165/104.33; 165/185; 165/80.2

[58] Field of Search .......... 361/702–704, 361/707, 715, 719; 257/718, 719, 721, 722, 727; 174/16.1, 16.3; 165/80.2, 80.3, 185

[56] References Cited

U.S. PATENT DOCUMENTS

| | | | |
|---|---|---|---|
| 5,019,940 | 5/1991 | Clemens | 361/723 |
| 5,302,853 | 4/1994 | Volz et al. | 257/707 |
| 5,473,510 | 12/1995 | Dozier, II | 361/719 |
| 5,703,753 | 12/1997 | Mok | 361/715 |
| 5,737,187 | 4/1998 | Nguyen et al. | 361/704 |
| 5,883,782 | 3/1999 | Thurston et al. | 361/704 |
| 5,894,408 | 4/1999 | Stark et al. | 361/704 |
| 5,945,736 | 8/1999 | Rife et al. | 257/719 |
| 5,959,838 | 9/1999 | Liang | 361/697 |

*Primary Examiner*—Leo P. Picard
*Assistant Examiner*—Boris L. Chervinsky
*Attorney, Agent, or Firm*—Blakely, Sokoloff, Taylor & Zafman LLP

[57] ABSTRACT

An apparatus is disclosed for attaching a thermal solution to a mini-cartridge. The apparatus comprises: a bracket adapted to be snapped into position around the mini-cartridge; two or more threads formed in the bracket, the threads positioned such that when the bracket is snapped into position around the mini-cartridge the threads are located on the side of the mini-cartridge opposite from the side adjacent to the thermal solution; and screws adapted to run through holes in the mini-cartridge to engage with the threads and to fixedly attach the thermal solution to the mini-cartridge.

18 Claims, 9 Drawing Sheets

THERMAL ATTACHMENT BRACKET FOR MINI CARTRIDGE PACKAGE TECHNOLOGY

BACKGROUND OF THE INVENTION

1. Field of the Invention

This invention relates thermal attachment design. More particularly, the invention relates to an improved apparatus for securing a thermal solution or other cooling device to a mini-cartridge device.

2. Description of the Related Art

A mini-cartridge is a packaging technology designed to protect the electronic components of a printed circuit board (hereinafter "PCB") and to aid in controlling the thermal interface between the PCB and a thermal attachment (e.g., a heat-sink). As illustrated in FIG. 1, one embodiment of a mini-cartridge includes a top cover 110 and a bottom cover 120 which, when attached, surround the PCB substrate 130 and its electronic components (e.g., 140, 150).

The mini-cartridge not only protects the PCB but also provides an interface for connecting the PCB to external electronic components. For example, when a mini-cartridge is provided for a microprocessor and its related circuitry, the cartridge can be secured to a motherboard simply by inserting the cartridge into a motherboard-mounted connector, rather than permanently soldering the mini-cartridge to the motherboard. The mini-cartridge thereby provides protection for the underlying microprocessor and also provides a simplified system for replacing the microprocessor (e.g., in the event that it malfunctions or becomes obsolete).

Electronic components such as microprocessor 210 as illustrated in FIG. 2A may dissipate a significant amount of heat. Therefore, when a microprocessor 210 or other high-speed electronic component is secured within a mini-cartridge as described above, a heat dissipation mechanism is required. Otherwise the increased heat trapped within the cartridge could degrade processor performance and/or damage the processor.

SUMMARY OF THE INVENTION

An apparatus is disclosed for attaching a thermal solution to a mini-cartridge. The apparatus comprises: a bracket adapted to be snapped into position around the mini-cartridge; two or more threads formed in the bracket, the threads positioned such that when the bracket is snapped into position around the mini-cartridge the threads are located on the side of the mini-cartridge opposite from the side adjacent to the thermal solution; and screws adapted to run through holes in the mini-cartridge to engage with the threads and to fixedly attach the thermal solution to the mini-cartridge.

BRIEF DESCRIPTION OF THE DRAWINGS

A better understanding of the present invention can be obtained from the following detailed description in conjunction with the following drawings, in which.

DETAILED DESCRIPTION OF THE PREFERRED EMBODIMENT

What is needed is an improved apparatus for attaching a thermal solution to a mini-cartridge. What is also needed is a thermal attachment apparatus which will place minimal stress on the printed circuit board ("PCB") and associated electronic components secured within the mini-cartridge. What is also needed is an apparatus which will provide for simple attachment and detachment of the mini-cartridge to a motherboard. What is also needed—particularly for mobile mini-cartridge applications (i.e., within a notebook or laptop computer)—is a thermal attachment apparatus which will occupy a limited amount of space around the mini-cartridge to which it is attached.

Figure 1:
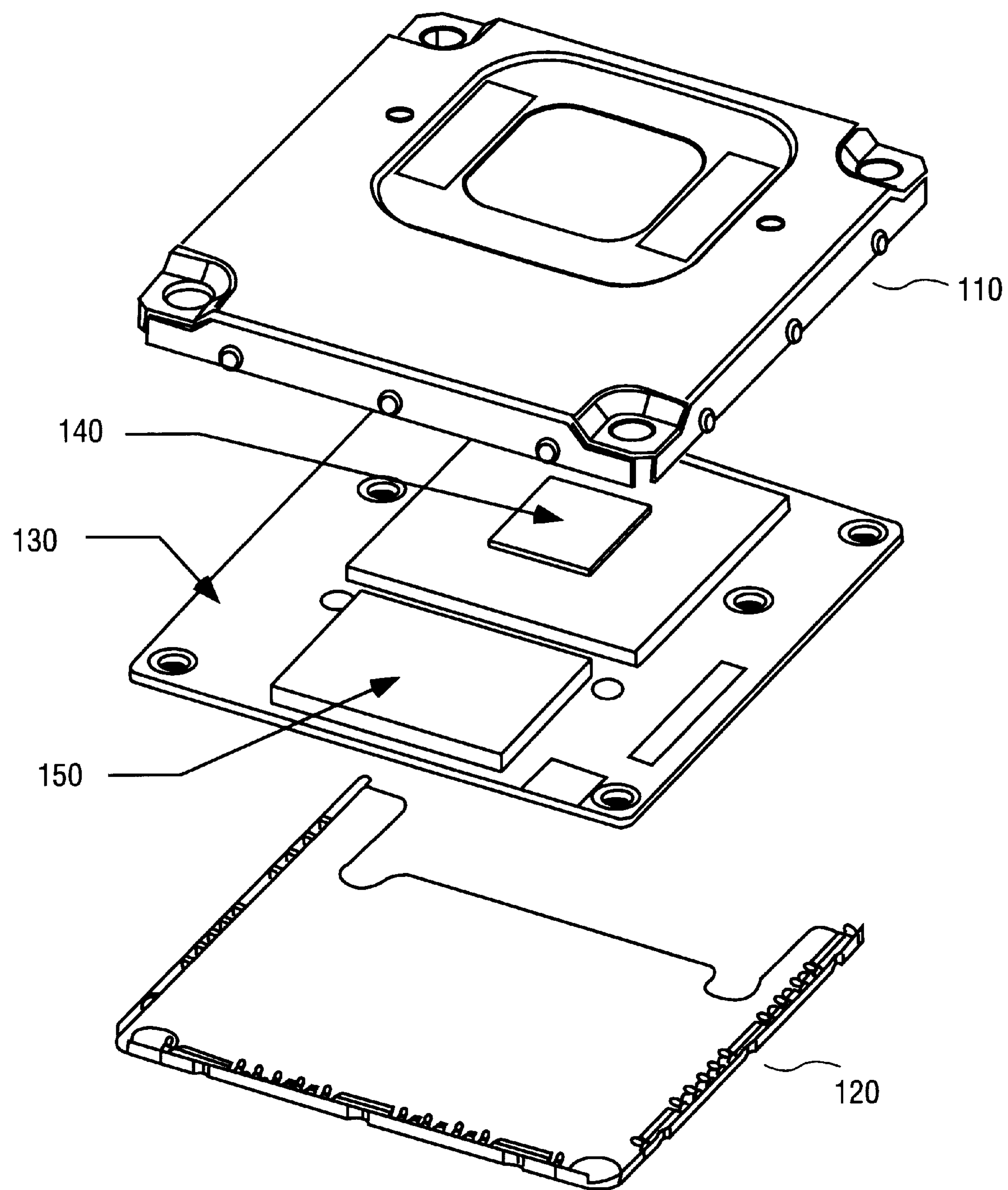
FIG. 1 illustrates a top cover and a bottom cover of a mini-cartridge device.
Figure 2A:
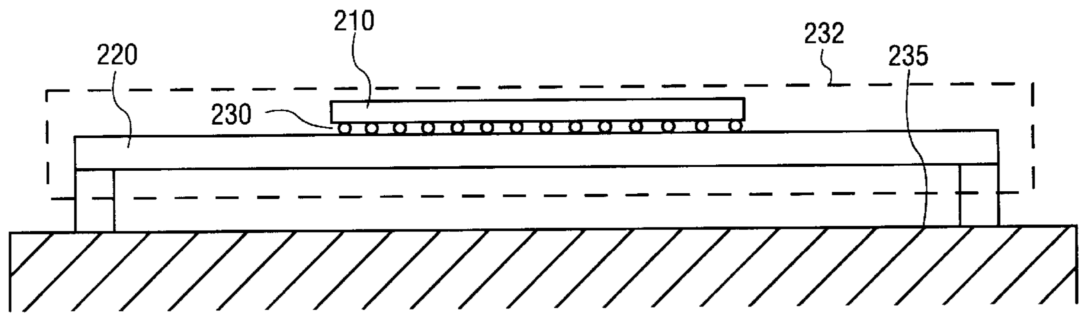
FIG. 2A illustrates a mini-cartridge secured to a motherboard.

The PCB substrate 130 illustrated in FIG. 1 may be populated on both sides with different microprocessor components. These components are frequently surface-mounted to the PCB using Ball Grid Array technology (hereinafter "BGA-technology") connections. As shown in FIG. 2A, using BGA-technology a microprocessor 210 (or other electronic component such as cache memory) may be electrically connected to a PCB substrate 220 using a grid of solder balls 230. BGA connections are known for their compact size, high lead count and low inductance, all of which provide for lower voltage implementations.

The PCB and associated microprocessor illustrated in FIG. 2A is shown surrounded by a mini-cartridge 232 and mounted to a motherboard surface 235. Additional electrical connections between the mini-cartridge 232, PCB 220, microprocessor 210 and motherboard surface 235 are not illustrated in FIG. 2A because they are not necessary for an understanding of the present thermal attachment solution.

Figure 2B:
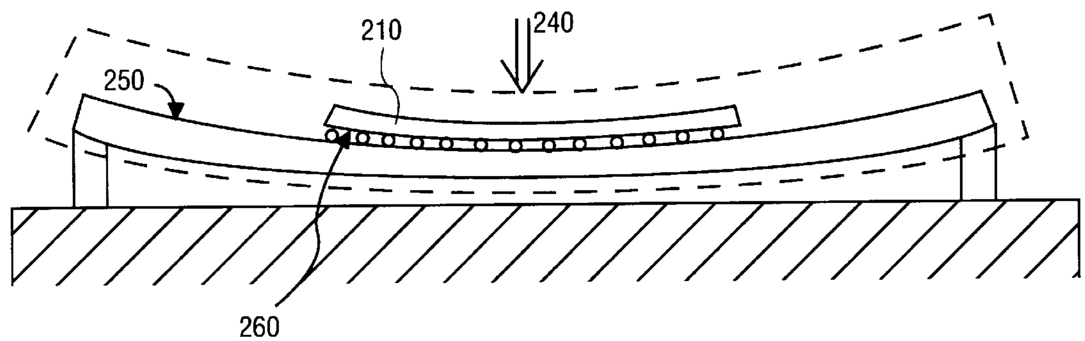
FIG. 2B illustrates a mini-cartridge with a force applied to its external surface.

BGA connections, while providing the benefits described above, are particularly susceptible to damage due to warpage of the PCB. As illustrated in FIG. 2B, if a force 240 is applied to one side of the mini-cartridge, both the PCB 220 and microprocessor 210 will bend along with the mini-cartridge 232 in the direction of the force (i.e., towards motherboard surface 235). As a result, with the lower surface 260 of the microprocessor and the top surface 250 of the PCB will induce shear stresses on the solder balls 230 due to the change in relative positions of the two surfaces 250 and 260. This may lead to failure of the microprocessor and/or increased susceptibility to environmental stresses.

Figure 2C:
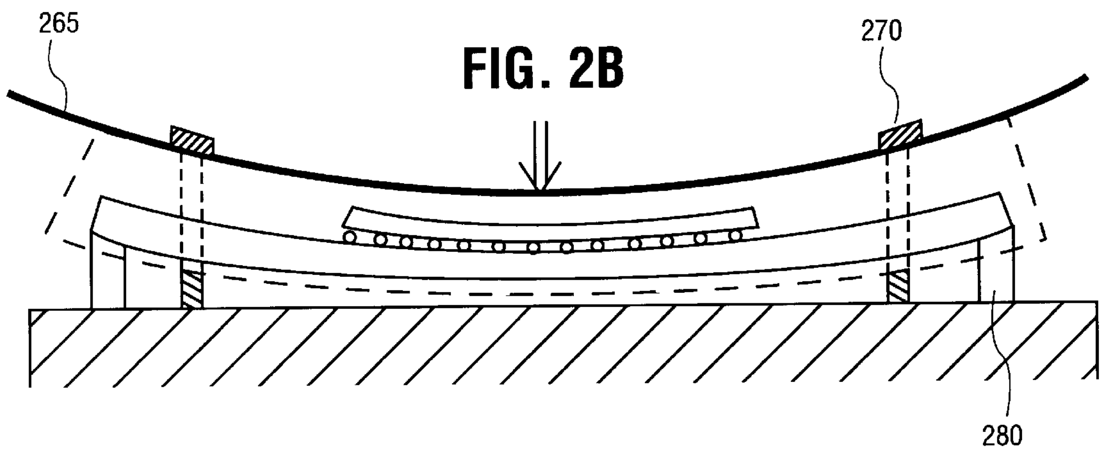
FIG. 2C illustrates a thermal solution secured to a mini-cartridge by attachment to a motherboard.

As shown in FIG. 2C, one method for attaching a thermal solution 265 is to connect it to the motherboard 235 using screws 270 which are inserted though holes in the mini-cartridge 232. As can be seen from FIG. 2C, however, this method of attachment can produce the same type of warpage and shear stress on the solder balls 260 as those illustrated in FIG. 2B if the screws 270 are over-torqued. This type of warpage may be more attenuated when the thermal attachment screws are positioned near the mini-cartridge/motherboard mounting points 280.

One possible solution to the warpage problem is to tightly control the relative heights of the thermal attach screws 270 and the flatness of the motherboard into which they are captured. However, this method is expensive and may not be achievable in practice.

Figure 3A:
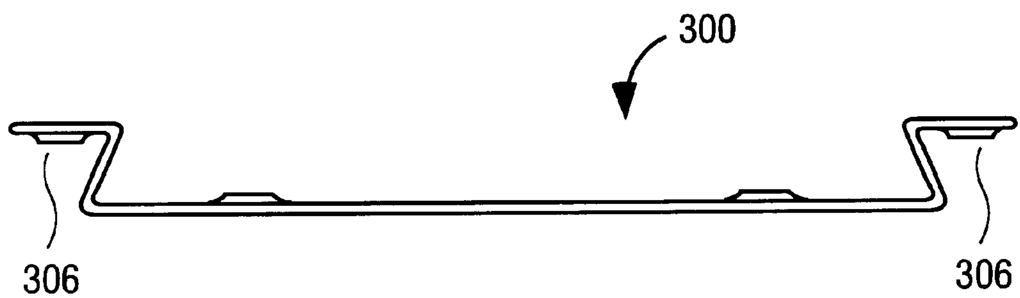
FIG. 3A illustrates one embodiment of a thermal attachment bracket for securing a thermal solution to a mini-cartridge.
Figure 3B:
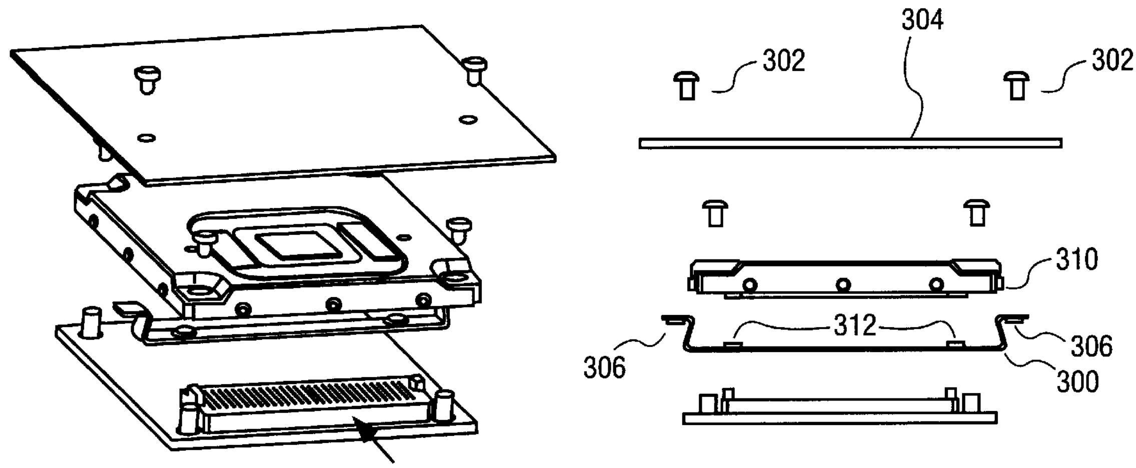
FIG. 3B illustrates the embodiment of the thermal attachment bracket of FIG. 3A about to be secured to a thermal solution and a mini-cartridge.

A better solution is to provide a thermal attachment bracket 300 as illustrated in FIG. 3A. The bracket 300 is shaped so that it can be easily snapped into position around the mini-cartridge. A set of threads 306 are formed in the bracket 300. As shown in FIG. 3B, the threads 306 provide the engagement for matching threads of screws 302 used to secure a thermal solution 304 to the mini cartridge 310.

The thermal solution 304 and the thermal attachment bracket 300 of this embodiment are directly connected to one another outside of the periphery of the mini-cartridge package as shown in FIG. 3B. That is, the portion of the bracket 300 on which the threads 306 reside is formed such that when the thermal solution 304 is placed in position next to the mini-cartridge 310, the thermal solution 304 is directly adjacent to the portion of the bracket 300 which includes the threads 306. The thermal solution 304 includes holes which align with the threads 306 in the bracket 300 (through which the screws 302 will be inserted to secure the thermal solution 304).

Figure 3C:
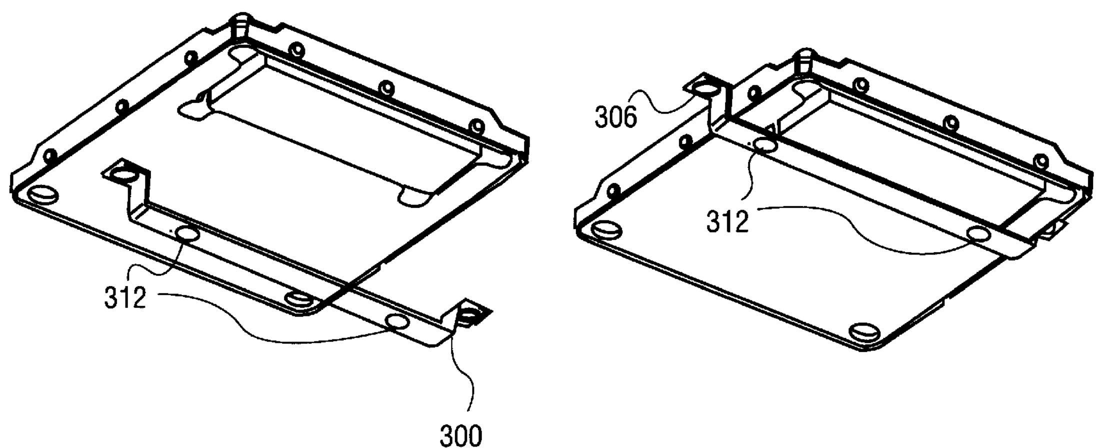
FIG. 3C illustrates the embodiment of the thermal attachment bracket of FIG. 3A positioned below a mini-cartridge.

This embodiment of the thermal attachment bracket 300 may also include one or more protrusions 312 (e.g., thread bosses that extrude upward from the bracket as shown in FIGS. 3B and 3C). The protrusions 312 match up with apertures in the mini-cartridge and are used to accurately position the thermal attachment bracket 300 around the mini-cartridge before the thermal solution 304 is attached. Alternatively, apertures may be formed in the bracket and protrusions (or other positional elements) may be formed on the mini-cartridge.

Figure 3D:
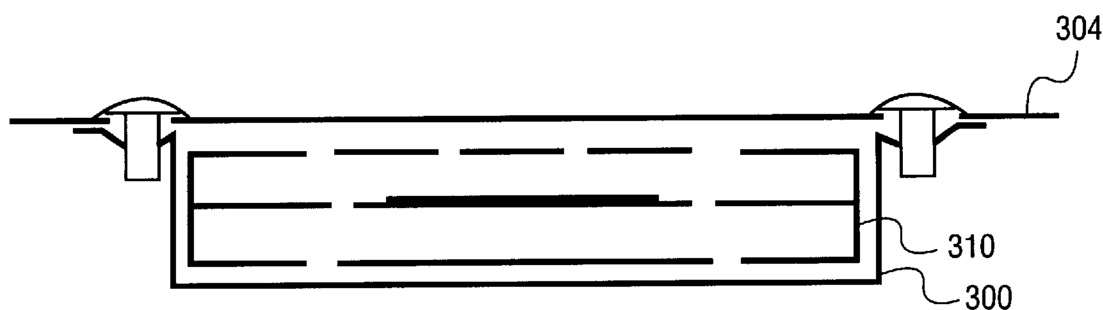
FIG. 3D illustrates the embodiment of the thermal attachment bracket of FIG. 3A secured to a thermal solution.
Figure 3E:
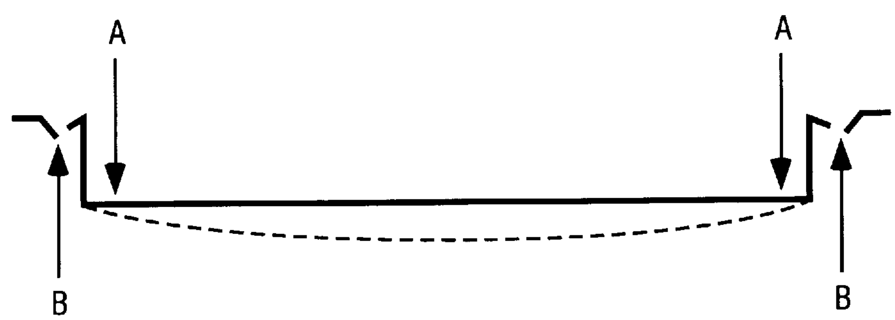
FIG. 3E illustrates a free body diagram of the thermal attachment bracket of FIG. 3D when secured to thermal solution.
Figure 3F:
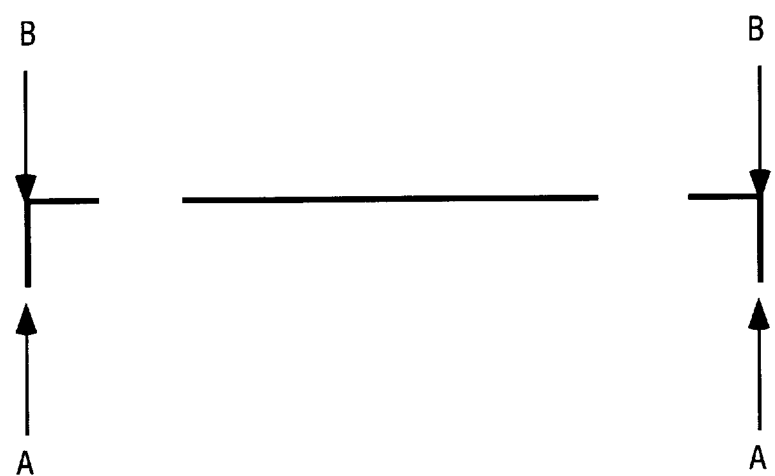
FIG. 3F illustrates a free body diagram of the mini-cartridge of FIG. 3D.

FIG. 3D is an illustration of the thermal attachment bracket 300 in position, securing the thermal solution 304 to the mini-cartridge 310. FIG. 3E, which corresponds to FIG. 3D, is a free body diagram illustrating the two forces, force A 320 and force B 325 which act on the thermal attachment bracket 300 when connected to the thermal solution 304. The two forces 320 and 325 may cause the thermal attachment bracket to bend slightly as shown. However, as illustrated in FIG. 3E—a free body diagram of the forces acting on the mini-cartridge itself—the two forces, A 320 and B 325, act in direct opposition to one another. Accordingly, the present embodiment of the thermal attachment bracket 300 secures the mini-cartridge 310 to the thermal solution 304 without bending the mini-cartridge as does the embodiment illustrated in FIG. 3C. As a result, the BGA connection between the PCB and the microprocessor (and/or other electrical components) is no longer subject to a potentially damaging sheering force and the microprocessor-PCB connection is less likely to be damaged.

Figure 4A:
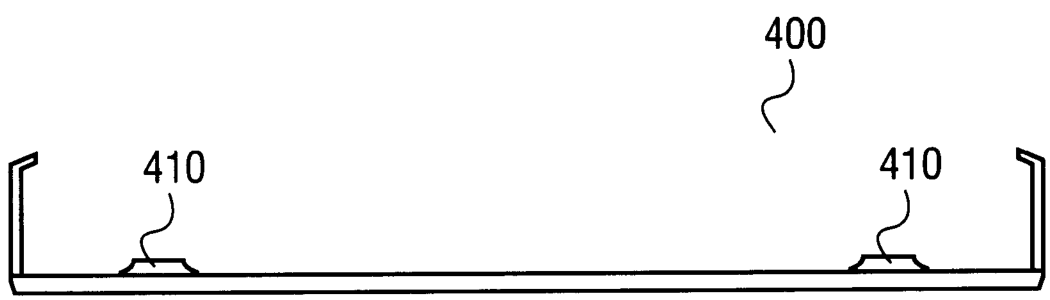
FIG. 4A illustrates an embodiment the thermal attachment bracket for securing a thermal solution to a mini-cartridge.
Figure 4B:
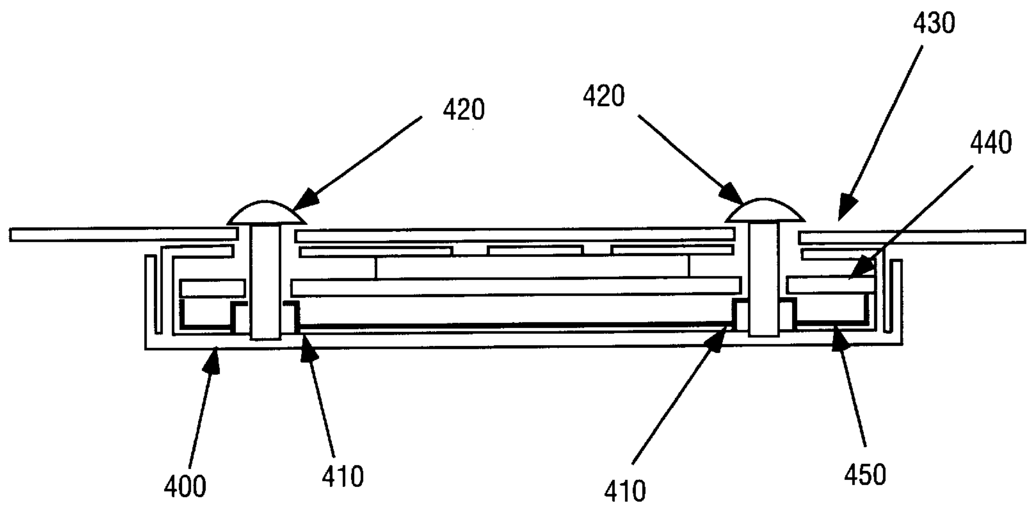
FIG. 4B illustrates a side view of the thermal attachment bracket of FIG. 4A attached to a thermal solution.

A second embodiment of a thermal attachment bracket 400 is illustrated in FIG. 4A. The threads 410 of the thermal attachment bracket 400 are positioned so as to be located on the secondary side of the mini-cartridge 450 (i.e., the side opposite the thermal solution 430) when attached to the thermal solution 430. As illustrated in FIG. 4B, screws 420 which secure the thermal solution 430 extend through the mini-cartridge 450 to engage the threads 410 on the other side. The screws 410 are then torqued to a specified value (e.g., 2 inch-lbs.) to secure the assembly together.

The threads 410 of the present embodiment are sized to contact the secondary side of the mini-cartridge 450 to provide a hard-stop point of leverage for the securing screws 420 to be torqued against. The rails 460 of the present embodiment provide high stiffness such that the securing screws 420 can be sufficiently torqued without excessively bending the bracket 400 and/or damaging the mini-cartridge.

Figure 4C:
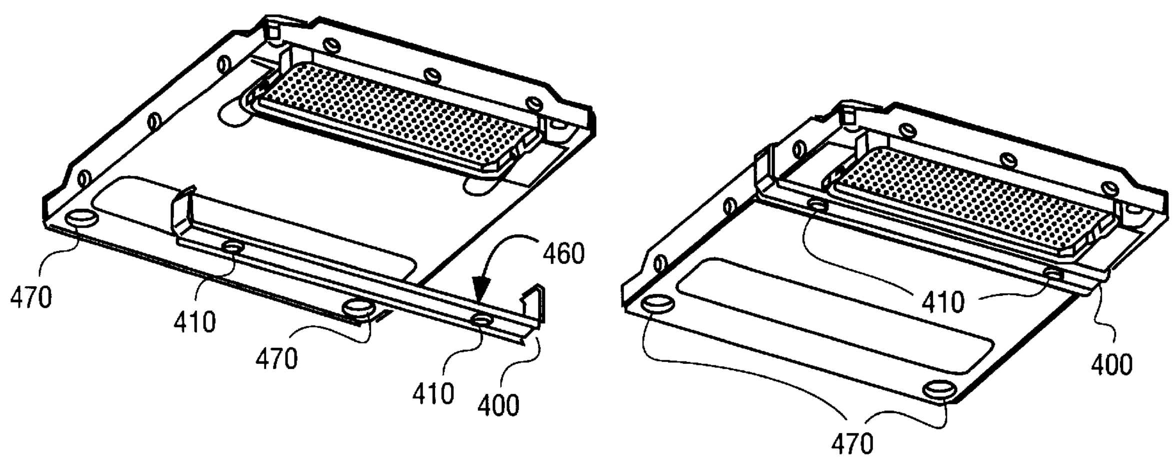
FIG. 4C illustrates the thermal attachment bracket of FIG. 4A positioned below a mini-cartridge.

The present embodiment of the thermal attachment bracket 400 is illustrated being snapped into position around the mini-cartridge in FIG. 4C. By floating a thermal attachment bracket 400 with a set of threads 410 below the mini-cartridge as described, the mechanical stresses on the mini-cartridge illustrated in FIG. 2C are minimized. As a result, mechanical mounting and thermal attachment of the mini-cartridge is achieved while minimizing the risk to on board components.

Figure 5A:
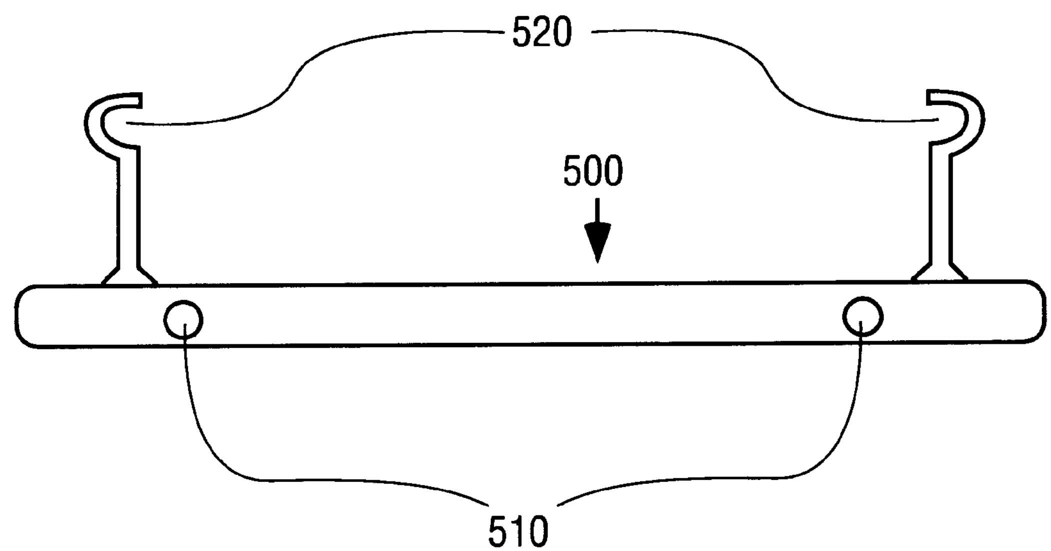
FIG. 5A illustrates one embodiment of the thermal attachment bracket for securing a thermal solution to a mini-cartridge.

Another embodiment of the thermal attachment bracket 500 is illustrated in FIG. 5. Like the previous embodiment, the threads 510 of this embodiment are positioned so as to be located on the secondary side of the mini-cartridge (i.e., the side opposite the thermal solution) when attached to the thermal solution.

Figure 5B:
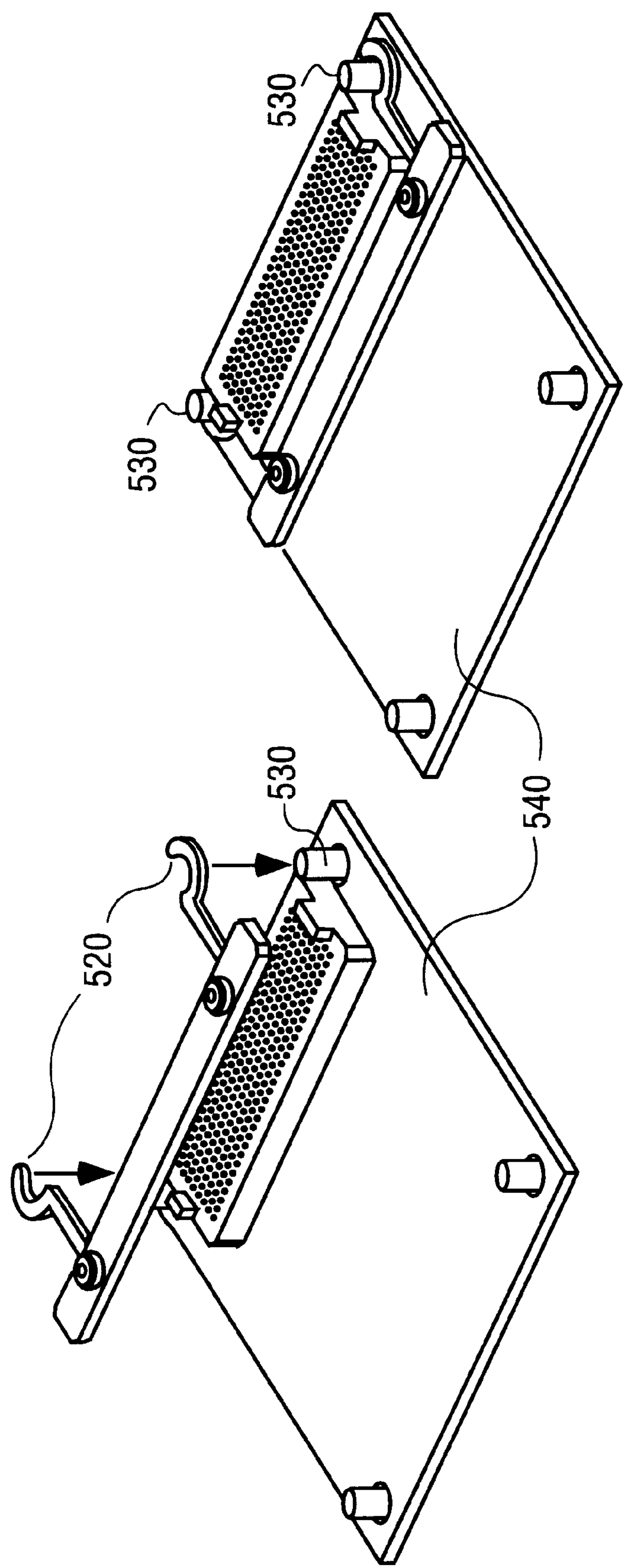
FIG. 5B illustrates the thermal attachment bracket of FIG. 5A positioned above a motherboard.

The primary difference between this embodiment and the previous embodiments is the way in which the thermal attachment bracket 500 is positioned with respect to the mini-cartridge before the thermal solution is attached. Specifically, the previous two thermal attachment brackets snapped into position around the mini-cartridge before the thermal solution was attached. By contrast, as illustrated in FIG. 5B, the present embodiment initially rests on the motherboard 540 and is positioned by two positioning arms 520 which reference one or more elements 530 on the motherboard. Thus, when rested on the motherboard 540, the threads 510 of the present thermal attachment bracket 500 are positioned directly below holes in the mini-cartridge through which screws are applied to secure the thermal solution (as described above with respect to the previous embodiment).

It should be noted that the different embodiments of thermal attachment threaded brackets described herein can be manufactured using various manufacturing techniques including, for example, injection-molding plastic, forming from sheet metal, and injection molding or casting of metal. Moreover, one of ordinary skill in the art will readily recognize from the foregoing discussion that alternative embodiments of the structures and methods illustrated herein may be employed without departing from the principles of the invention. Throughout this detailed description, numerous specific details are set forth in order to provide a thorough understanding of the present invention. It will be appreciated by one having ordinary skill in the art, however, that the present invention may be practiced without such specific details. In other instances, well known structures have not been described in detail in order to avoid obscuring the subject matter of the present invention. The invention should, therefore, be measured in terms of the claims which follow.

What is claimed is:

1. An apparatus for attaching a thermal solution to a mini-cartridge comprising:

a bracket having one or more securing elements adapted to fit around the mini-cartridge, the securing elements shaped in a manner such as to allow the bracket to be snapped into position onto the mini-cartridge;

two or more threaded holes formed in the bracket, the threaded holes positioned such that when the bracket is snapped into position onto the mini-cartridge the threaded holes are located adjacent to the thermal solution; and screws adapted to engage with the threaded holes and fixedly attach the thermal solution to the mini-cartridge.

2. The apparatus as claimed in claim 1 wherein the mini-cartridge contains a microprocessor residing on a PCB.

3. The apparatus as claimed in claim 1 wherein the bracket is comprised of sheet metal.

4. The apparatus as claimed in claim 1 wherein the bracket is comprised of plastic.

5. The apparatus as claimed in claim 1 wherein the bracket is comprised of metal.

6. The apparatus as claimed in claim 1 wherein the bracket further includes one or more positional elements which match up with one or more positional elements on the mini-cartridge for positioning the bracket around the mini-cartridge.

7. The apparatus as claimed in claim 6 wherein the positional elements on the bracket are protrusions.

8. The apparatus as claimed in claim 6 wherein the positional elements are apertures.

9. An apparatus for attaching a thermal solution to a mini-cartridge comprising:

a bracket having one or more securing elements adapted to fit around the mini-cartridge, the securing elements shaped in a manner such as to allow the bracket to be snapped into position onto the mini-cartridge;

two or more threaded holes formed in the bracket, positioned such that when the bracket is snapped into position the threaded holes are aligned with holes in the mini cartridge; and screws adapted to run through holes in the mini-cartridge to engage with the threaded holes and fixedly attach the thermal solution to the mini-cartridge.

10. The apparatus as claimed in claim 9 wherein the bracket is comprised of sheet metal.

11. The apparatus as claimed in claim 9 wherein the bracket is comprised of plastic.

12. The apparatus as claimed in claim 9 wherein the bracket is comprised of metal.

13. The apparatus as claimed in claim 9 wherein the bracket further includes one or more positional elements which match up with one or more positional elements on the mini-cartridge for positioning the bracket around the mini-cartridge.

14. The apparatus as claimed in claim 13 wherein the positional elements on the bracket are protrusions.

15. The apparatus as claimed in claim 13 wherein the positional elements are apertures.

16. The apparatus as claimed in claim 9 wherein the mini-cartridge contains a microprocessor residing on a PCB.

17. A method for securing a thermal solution to a mini-cartridge comprising the steps of:

fitting one or more securing elements of a thermal attachment bracket around the mini-cartridge, the securing elements shaped in a manner such as to allow the thermal attachment bracket to be snapped into position onto the mini-cartridge, said thermal attachment bracket having two or more threaded holes formed therein, the threaded holes positioned such that when the thermal attachment bracket is snapped into position onto the mini-cartridge the threaded holes are located adjacent to the thermal solution;

fixedly attaching said mini-cartridge to a motherboard; and fixedly attaching said thermal solution to said mini-cartridge using screws adapted to engage with the threaded holes in said thermal attachment bracket.

18. A system for attaching a thermal solution to a mini-cartridge comprising:

a motherboard;

a mini cartridge, fixedly attached to said motherboard;

a bracket having one or more securing elements fitted around the mini-cartridge, the securing elements shaped in a manner such that the bracket is snapped into position onto the mini-cartridge;

two or more threaded holes formed in the bracket, the threads positioned such that when the bracket is snapped into position around the mini-cartridge the threaded holes are located adjacent to the thermal solution; and screws adapted to engage with the threaded holes and fixedly attach the thermal solution to the mini-cartridge.

* * * * *